(12) United States Patent
Lim et al.

(10) Patent No.: US 12,013,306 B2
(45) Date of Patent: Jun. 18, 2024

(54) APPARATUS AND METHOD FOR DIAGNOSING FAILURE OF BYPASS VALVE

(71) Applicant: Vitesco Technologies GmbH, Hannover (DE)

(72) Inventors: JongSuk Lim, Munich (DE); HanYong Park, Munich (DE); DoWan Kim, Munich (DE)

(73) Assignee: VITESCO TECHNOLOGIES GMBH, Hannover (DE)

( * ) Notice: Subject to any disclaimer, the term of this patent is extended or adjusted under 35 U.S.C. 154(b) by 652 days.

(21) Appl. No.: 17/418,470

(22) PCT Filed: Oct. 23, 2019

(86) PCT No.: PCT/EP2019/078796
§ 371 (c)(1),
(2) Date: Jun. 25, 2021

(87) PCT Pub. No.: WO2020/104131
PCT Pub. Date: May 28, 2020

(65) Prior Publication Data
US 2022/0074812 A1    Mar. 10, 2022

(30) Foreign Application Priority Data

Nov. 19, 2018    (KR) .................. 10-2018-0143005

(51) Int. Cl.
*G01M 3/40*    (2006.01)
*F02B 39/10*    (2006.01)
(Continued)

(52) U.S. Cl.
CPC .......... *G01M 13/003* (2019.01); *F02B 39/10* (2013.01); *F02B 39/16* (2013.01); *F02D 41/221* (2013.01);
(Continued)

(58) Field of Classification Search
CPC ...... G01M 3/40; G01M 13/003; G01M 15/04; G01M 17/007; F02B 33/34; F02B 33/40;
(Continued)

(56) References Cited

U.S. PATENT DOCUMENTS 7,578,128 B2    8/2009    Miyauchi et al. .............. 60/611
8,849,548 B2    9/2014    Luft et al. ..................... 701/107
(Continued)

FOREIGN PATENT DOCUMENTS

CN    103946513 A    7/2014    ............. F02B 37/12
CN    105909372 A    8/2016    ............. F02B 37/04
(Continued)

OTHER PUBLICATIONS

English Translation of JP-2004232541-A (Year: 2004).*
(Continued)

*Primary Examiner* — Alexander A Mercado
(74) *Attorney, Agent, or Firm* — Slayden Grubert Beard PLLC

(57) ABSTRACT

Some embodiments of the teachings herein include an apparatus for diagnosing bypass valve failure in an electric supercharger with a motor and an electric compressor comprising: a bypass valve on a bypass line branching from an intake line with the electric supercharger; and a control unit which assesses the vehicle-state information to determine whether failure criteria of a bypass valve start are satisfied. If the failure criteria are satisfied, the control unit transmits 'open' or 'close' control instructions to the bypass valve and transmits, to the electric supercharger, a specific rotational-speed target value for determining whether the bypass valve is in the normal open state or the normal closed state, thereby determining whether the bypass valve is subject to stuck-open failure or stuck-closed failure.

12 Claims, 4 Drawing Sheets

(51) Int. Cl.
  *F02B 39/16*    (2006.01)
  *F02D 41/22*    (2006.01)
  *G01M 13/003*   (2019.01)
  *G01M 15/04*    (2006.01)
  *G01R 19/165*   (2006.01)

(52) U.S. Cl.
  CPC ....... *G01M 15/04* (2013.01); *G01R 19/16571* (2013.01); *F02D 2200/0406* (2013.01); *F02D 2200/50* (2013.01); *F02D 2200/602* (2013.01)

(58) Field of Classification Search
  CPC ........ F02B 37/162; F02B 39/10; F02B 39/16; F02B 2037/122; F02D 41/0007; F02D 41/123; F02D 41/221; F02D 2200/0406; F02D 2200/50; F02D 2200/602; G01R 19/16571; Y02T 10/12
  See application file for complete search history.

(56) References Cited

U.S. PATENT DOCUMENTS

| | | | |
|---|---|---|---|
| 10,006,389 B2 | 6/2018 | Fukui et al. | |
| 10,167,804 B2 | 1/2019 | Ossareh | F02D 41/221 |
| 10,174,688 B2 | 1/2019 | Han et al. | |
| 2016/0245155 A1 | 8/2016 | Iwata | 60/602 |
| 2017/0159586 A1 | 6/2017 | Takahashi | 701/103 |
| 2019/0186390 A1* | 6/2019 | Kelly | F02B 39/10 |
| 2020/0086715 A1* | 3/2020 | Pursifull | B60H 1/00885 |
| 2020/0240334 A1* | 7/2020 | Bastanipour | F02D 23/00 |

FOREIGN PATENT DOCUMENTS

| | | | | |
|---|---|---|---|---|
| DE | 10 2015 118971 | | 5/2016 | ............. F02D 41/22 |
| EP | 2 993 328 | | 3/2016 | ............. F02B 33/00 |
| JP | H05 248250 | | 9/1993 | ............. F02B 33/00 |
| JP | 2003328766 A | | 11/2003 | ............. F01N 13/08 |
| JP | 2004232541 A | * | 8/2004 | ............. F02B 33/34 |
| JP | 2004232541 A | | 8/2004 | ............. F02B 37/00 |
| JP | 2004293442 A | * | 10/2004 | |
| JP | 2004293442 A | | 10/2004 | ............. F02B 33/44 |
| JP | 2008025426 A | | 2/2008 | ............. F02B 33/00 |
| JP | 2012092744 A | | 5/2012 | ............... F01L 1/46 |
| JP | 2015 068290 | | 4/2015 | ............. F02D 45/00 |
| JP | 2016 084737 | | 5/2016 | ............. F02B 39/16 |
| JP | 2017180150 A | | 10/2017 | ............. F02B 37/00 |
| JP | 2018 145845 | | 9/2018 | ............. F02B 33/00 |
| JP | 2018145845 A | * | 9/2018 | |
| KR | 20010063977 A | | 7/2001 | ............. G01C 23/00 |
| KR | 101714265 B1 | | 3/2017 | ............. F02B 33/00 |
| KR | 101809186 B1 | | 12/2017 | ............... F01N 3/08 |

OTHER PUBLICATIONS

Korean Office Action, Application No. 2019011176248, 8 pages, Feb. 15, 2019.

Chinese Office Action, Application No. 201980089552.5, 23 pages, Sep. 28, 2022.

Search Report for International Application No. PCT/EP2019/078796, 12 pages, Jan. 29, 2020.

* cited by examiner (a)

(b)

APPARATUS AND METHOD FOR DIAGNOSING FAILURE OF BYPASS VALVE

CROSS-REFERENCE TO RELATED APPLICATIONS

This application is a U.S. National Stage Application of International Application No. PCT/EP2019/078796 filed Oct. 23, 2019, which designates the United States of America, and claims priority to KR Application No. 10-2018-0143005 filed Nov. 19, 2018, the contents of which are hereby incorporated by reference in their entirety.

TECHNICAL FIELD

The present disclosure relates to internal combustion engines. Various embodiments of the teachings herein may include apparatuses and/or methods for diagnosing bypass valve failure in an internal combustion engine fitted with an electric supercharger system.

BACKGROUND

The engine of a vehicle generates power by mixing, at a suitable ratio, fuel with air introduced from the outside and combusting same. In the process of generating power by running the engine, the desired output and combustion efficiency can be obtained only if external air is sufficiently supplied for combustion. To achieve this, a turbocharger is used as an apparatus for supercharging air for combustion in order to raise the combustion efficiency of the engine.

As an example of a supercharging apparatus, some electric superchargers compress external air by driving a compressor using a motor. Electric superchargers have hardly any turbo lag since they are driven by means of a battery, and predominantly supply supercharged air to the combustion chamber in a low-speed, low-load region. Furthermore, in comparison to an exhaust turbine-type supercharger (turbocharger) which uses exhaust from the engine, the electric supercharger has the advantages of excellent reaction to the throttle (accelerator) and of being highly effective at supercharging at low revolutions. However, there are drawbacks such as engine efficiency falling due to driving the compressor all the time, and the output at high revolutions being inferior to turbochargers.

Hence, electric supercharger systems are sometimes used together with an internal combustion engine that comprises a conventional supercharger and are sometimes used as a substitute supercharger in a conventional turbocharger system. When an electric supercharger system is used in an internal combustion engine that comprises a conventional supercharger, it is possible to improve the low-end torque and responsiveness of supercharging and it is possible to reduce harmful exhaust gases as a result of the reduction of scavenging. Moreover, when used as a substitute supercharger in a conventional turbocharger system, there is the advantage in that it is possible to improve the combustion efficiency and the discharge of harmful exhaust gases by means of exhaust pumping work and back-pressure reduction.

Meanwhile, when an electric supercharger system is used in a conventional internal combustion engine, the use of a bypass valve is required during control of the supercharging pressure in order to prevent the fluctuation of the supercharging pressure during the transition period (non-boosting→boosting) and in order to use same as a recirculation valve for preventing surges under tip out (load reduction transition period) conditions. In order for a bypass valve included in such a supercharger system to function, failure diagnosis of the bypass valve should be performed, but, conventionally, in order to diagnose failure of the bypass valve, the failure diagnosis has been performed only through an electrical signal from a motor or a solenoid-type electronic valve.

In other words, in the prior art there has been a problem in that a misdiagnosis due to a feedback signal error is possible since diagnosis is performed through an electrical feedback signal of the motor or a solenoid-type electronic bypass valve, whilst, when a mechanical bypass valve is used, diagnosis is not possible. By way of example, there is a "Control Device for Drive Unit of Rotary Motor for Electrically Assisted Supercharger" described in Korean Registered Patent Publication 10-1274490 (Publication Date: 14 Jun. 2013).

SUMMARY

The teachings of the present disclosure may be used to alleviate the problems such as those described above and may include apparatuses and/or methods for diagnosing bypass valve failure in an internal combustion engine fitted with an electric supercharger system so as to allow failure diagnosis regardless of the type of bypass valve. For example, some embodiments of the teachings herein include an apparatus for diagnosing bypass valve failure comprising: an electric supercharger which comprises a motor and an electric compressor, which is actuated by means of the motor so as to supply supercharged air to the combustion chamber of an engine; a bypass valve provided on a bypass line which branches from an intake line where the electric supercharger is provided, and which joins same at the front end of the throttle valve which adjusts the intake amount supplied to the combustion chamber; a vehicle-state input unit into which vehicle-state information is input; and a control unit which receives input of the vehicle-state from the vehicle-state input unit so as to determine whether the failure diagnosis of a bypass valve start conditions are satisfied, and which, if the conditions for starting the failure diagnosis of the bypass valve are satisfied, transmits 'open' or 'close' control instructions to the bypass valve and transmits, to the electric supercharger, a specific rotational-speed target value for determining whether the bypass valve is in the normal open state or the normal closed state, thereby determining whether the bypass valve is subject to stuck-open failure or stuck-closed failure.

In some embodiments, the control unit receives input of the current operating state of the engine, the pedal on/off state, and the fuel-cut-period entry state from the vehicle-state input unit and decides that the failure diagnosis of a bypass valve start conditions are satisfied if, while the engine is currently operating, it is confirmed that during travel the driver's pedal is in the off-state and fuel-cut-period has been entered.

In some embodiments, if the conditions for starting the failure diagnosis of the bypass valve are satisfied, the control unit transmits an 'open' control instruction to the bypass valve and sends a first rotational-speed target value for determining whether the bypass valve is in the normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time so as to determine whether the bypass valve is subject to stuck-closed failure.

In some embodiments, when the first set time has elapsed after the amount of generated current of the electric supercharger has exceeded the threshold value for a stuck-closed failure diagnosis of the bypass valve, the control unit decides that the bypass valve is in a stuck-closed failure state.

In some embodiments, there is a first pressure sensor which detects the pressure between the electric supercharger and a bypass valve and a throttle valve, and if the conditions for starting the failure diagnosis of the bypass valve are satisfied, the control unit transmits a 'close' control instruction to the bypass valve and sends a second rotational-speed target value for determining whether the bypass valve is in the normal closed state, to the electric supercharger, and then, when the electric supercharger is operating at the second rotational-speed target value or is operating at a value within a predetermined range using the second rotational-speed target value as a reference, the control unit monitors the pressure detected by the first pressure sensor for a second set time and determines whether the bypass valve is subject to stuck-open failure.

In some embodiments, when the pressure value detected by the first pressure sensor is less than the threshold value for a stuck-open failure diagnosis of the bypass valve and the second set time has elapsed, the control unit decides that the bypass valve is in a stuck-open failure state.

As another example, some embodiments include a method for diagnosing bypass valve failure comprises the steps in which: a control unit receives input of vehicle-state information from a vehicle-state input unit and determines whether the failure diagnosis of the bypass valve start conditions are satisfied; if the failure diagnosis of the bypass valve start conditions are satisfied, the control unit transmits 'open' or 'close' control instructions to the bypass valve; the control unit transmits, to an electric supercharger, a specific rotational-speed target value for determining whether the bypass valve is in the normal open state or the normal closed state; and the control unit determines whether the bypass valve is subject to stuck-open failure or stuck-closed failure, characterized in that the electric supercharger comprises a motor and an electric compressor which is actuated by means of the motor so as to supply supercharged air to the combustion chamber of the engine, and in that the bypass valve is provided on a bypass line which branches from the intake line where the electric supercharger is provided, and which joins same to the front end of a throttle valve which adjusts the intake amount supplied to the combustion chamber.

In some embodiments, in the step of determining whether the failure diagnosis of a bypass valve start conditions are satisfied, the control unit receives input of the current operating state of the engine, the pedal on/off state, and the fuel-cut-period entry state from the vehicle-state input unit, and which decides that the failure diagnosis of the bypass valve start conditions are determined to be satisfied if, while the engine is currently operating, it is confirmed that during travel the driver's pedal is in the off-state and fuel-cut-period has been entered.

In some embodiments, if the conditions for starting the failure diagnosis of the bypass valve are satisfied, the control unit transmits an 'open' control instruction to the bypass valve and sends a first rotational-speed target value, for determining whether the bypass valve is in a normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time and determines whether the bypass valve is subject to stuck-closed failure.

In some embodiments, when the first set time has elapsed after the amount of generated current of the electric supercharger has exceeded the threshold value for a stuck-closed failure diagnosis of the bypass valve, the control unit decides that the bypass valve is in a stuck-closed failure state.

In some embodiments, there is a further step in which the control unit receives input of a pressure value from a first pressure sensor which detects the pressure between the electric supercharger and the bypass valve and throttle valve, characterized in that, if the conditions for starting the failure diagnosis of the bypass valve are satisfied, the control unit transmits an 'close' control instruction to the bypass valve and sends a second rotational-speed target value for determining whether the state is the normal closed state of the bypass valve, to the electric supercharger, and then, when the electric supercharger is operating at the second rotational-speed target value or is operating at a value within a predetermined range using the second rotational-speed target value as a reference, the control unit monitors the pressure detected by the first pressure sensor for a second set time and determines whether the bypass valve is subject to stuck-open failure.

In some embodiments, when the pressure value detected by the first pressure sensor is less than the threshold value for a stuck-open failure diagnosis of the bypass valve and the second set time has elapsed, the control unit decides that the bypass valve is in a stuck-open failure state.

BRIEF DESCRIPTION OF THE DRAWINGS

Hereinafter, an apparatus and method for diagnosing bypass valve failure will be described with reference to the accompanying drawings. In this context, the thickness of lines or the size of the components shown in the drawings may be exaggerated for clarity of the description and convenience.

DETAILED DESCRIPTION

Figure 1:
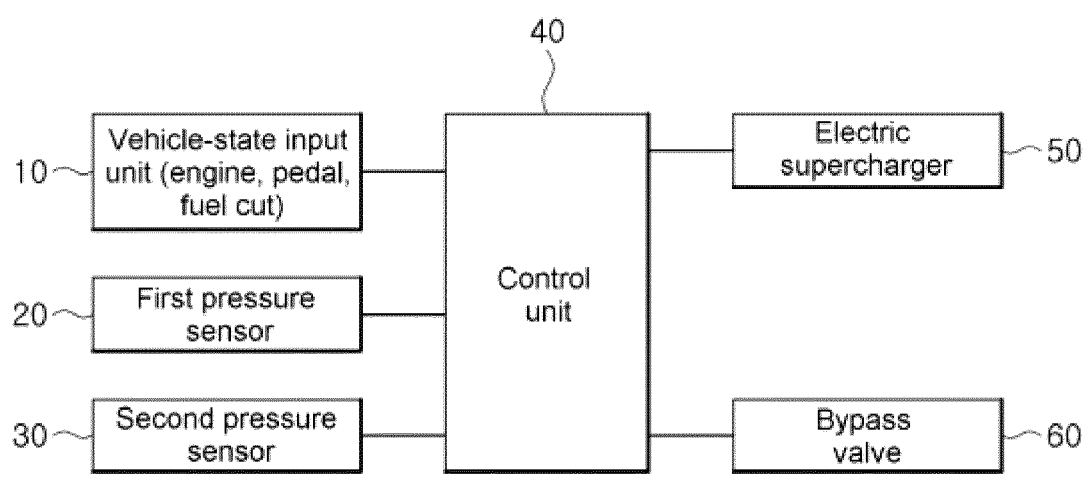
FIG. 1 is a block diagram of an apparatus for diagnosing bypass valve failure incorporating teachings of the present disclosure.

The teachings of the present disclosure include an apparatus for diagnosing bypass valve failure comprising: an electric supercharger which comprises a motor and an electric compressor, which is actuated by means of the motor, so as to supply supercharged air to the combustion chamber of an engine; a bypass valve provided on a bypass line which branches from an intake line where the electric supercharger is provided, and which joins same at the front end of a throttle valve which adjusts the intake amount supplied to the combustion chamber; a vehicle-state input unit into which vehicle-state information is input; and a control unit which receives input of the vehicle state from the vehicle-state input unit so as to decide whether the conditions for starting the failure diagnosis of the bypass valve are satisfied, and which, if the conditions for starting the failure diagnosis of the bypass valve are satisfied, transmits 'open' or 'close' control instructions to the bypass valve and transmits, to the electric supercharger, a specific rotational-speed target value for determining whether the bypass valve is in a normal open state or normal closed state, thereby determining whether the bypass valve is subject to stuck-open or stuck-closed failure.

In some embodiments, the control unit receives input of the current operating state of the engine, the pedal on/off state, and the fuel-cut-period entry state from the vehicle-state input unit, and decides that the conditions for starting the failure diagnosis of the bypass valve are satisfied if, while the engine is currently operating, it is confirmed that during travel the driver's pedal is in the off-state and the fuel-cut-period has been entered.

In some embodiments, if the conditions for starting the failure diagnosis of the bypass valve are satisfied, the control unit transmits an 'open' control instruction to the bypass valve and sends a first rotational-speed target value, for determining whether the bypass valve is in the normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time so as to determine whether the bypass valve is subject to stuck-closed failure.

In some embodiments, when the first set time has elapsed after the amount of generated current of the electric supercharger has exceeded the threshold value for a stuck-closed failure diagnosis of the bypass valve, the control unit decides that the bypass valve is in a stuck-closed failure state.

In some embodiments, there is a first pressure sensor which detects the pressure between the electric supercharger and bypass valve and the throttle valve, and if the conditions for starting the failure diagnosis of the bypass valve are satisfied, the control unit transmits a 'close' control instruction to the bypass valve and sends a second rotational-speed target value, for determining whether the bypass valve is in the normal closed state, to the electric supercharger, and then, when the electric supercharger is operating at the second rotational-speed target value or is operating at a value within a predetermined range using the second rotational-speed target value as a reference, the control unit monitors the pressure detected by the first pressure sensor for a second set time so as to determine whether the bypass valve is subject to stuck-open failure.

In some embodiments, when the pressure value detected by the first pressure sensor is less than the threshold value for a stuck-open failure diagnosis of the bypass valve and the second set time has elapsed, the control unit determines that the bypass valve is in a stuck-open failure state.

Some embodiments include a method for diagnosing bypass valve failure comprising: a control unit receives input of the vehicle-state information from the vehicle-state input unit so as to decide whether conditions for starting failure diagnosis of the bypass valve are satisfied; if the conditions for starting the failure diagnosis of the bypass valve are satisfied, the control unit transmits 'open' or 'close' control instructions to the bypass valve; the control unit transmits a specific rotational-speed target value, for determining whether the bypass valve is in the normal open state or normal closed state, to the electric supercharger; and the control unit determines whether the bypass valve is subject to stuck-open or stuck-closed failure, characterized in that the electric supercharger comprises a motor and an electric compressor, which is actuated by means of the motor, so as to supply supercharged air to the combustion chamber of the engine, and in that the bypass valve is provided on a bypass line which branches from the intake line where the electric supercharger is provided, and which joins to same at the front end of a throttle valve which adjusts the intake amount supplied to the combustion chamber.

In some embodiments, the control unit receives input of the current operating state of the engine, the pedal on/off state, and the fuel-cut-period entry state from the vehicle-state input unit, and decides that the conditions for starting the failure diagnosis of the bypass valve are satisfied if, while the engine is currently operating, it is confirmed that during travel the driver's pedal is in the off-state and fuel-cut-period has been entered.

In some embodiments, if the conditions for starting the failure diagnosis of the bypass valve are satisfied, the control unit transmits an 'open' control instruction to the bypass valve and sends a first rotational-speed target value, for determining whether the bypass valve is in the normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time so as to determine whether the bypass valve is subject to stuck-closed failure.

In some embodiments, when the first set time has elapsed after the amount of generated current of the electric supercharger has exceeded the threshold value for a stuck-closed failure diagnosis of the bypass valve, the control unit decides that the bypass valve is in a stuck-closed failure state.

In some embodiments, the control unit receives input of a pressure value from a first pressure sensor which detects the pressure between the electric supercharger and the bypass valve and throttle valve, and in that, if the conditions for starting the failure diagnosis of a bypass valve are satisfied, the control unit transmits a 'close' control instruction to the bypass valve and sends a second rotational-speed target value, for determining whether the bypass valve is in the normal closed state, to the electric supercharger, and then if the electric supercharger is operating at the second rotational-speed target value or is operating at a value within a predetermined range using the second rotational-speed target value as a reference, the control unit monitors the pressure detected by the first pressure sensor for a second set time so as to determine whether the bypass valve is subject to stuck-open failure.

In some embodiments, when the pressure value detected by the first pressure sensor is less than the threshold value for a stuck-open failure diagnosis of the bypass valve and the second set time has elapsed, the control unit decides that the bypass valve is in a stuck-open failure state.

Various embodiments of the teachings herein are capable of diagnosing failure regardless of the type of electronic or mechanical bypass valve, by performing failure diagnosis of the bypass valve through the value of the generated current from the drive motor in an internal combustion engine fitted with an electric supercharger system. Furthermore, the apparatuses and methods for diagnosing bypass valve failure may be able to aid the maintenance of an engine through transmission of the diagnosis results by distinguishing whether there is failure of the bypass valve, and able to prevent a breakdown due to engine abnormalities through activation of a 'limp home' mode when a bypass valve failure is determined.

Figure 3:
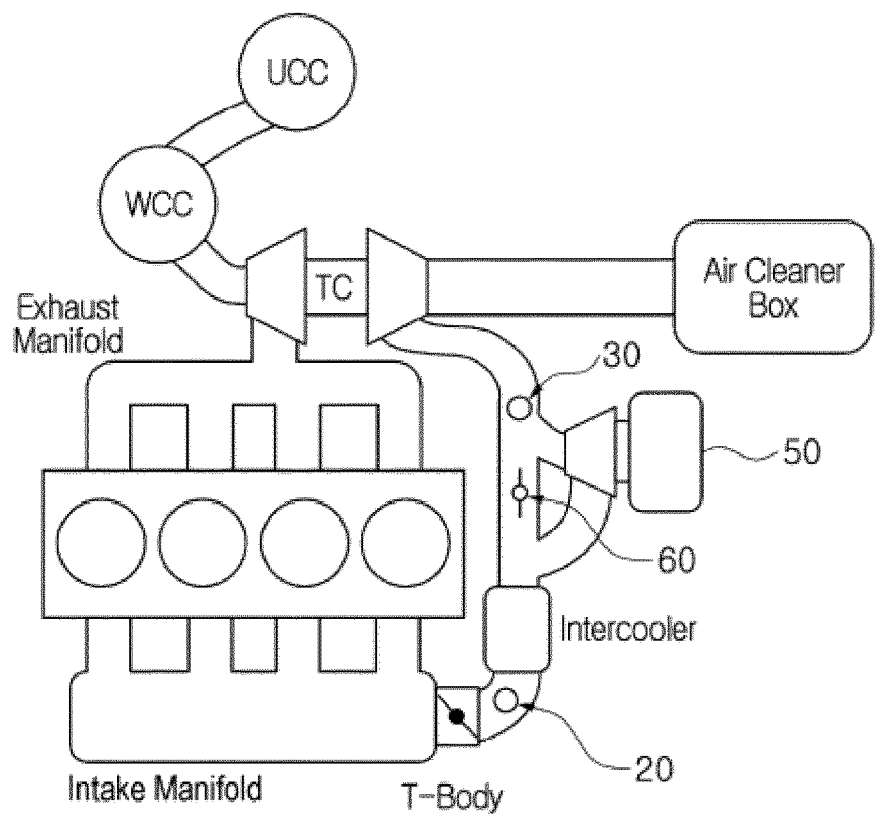
FIG. 3 is a drawing for explaining the schematic structure of an apparatus for diagnosing bypass valve failure incorporating teachings of the present disclosure.
Figure 3:
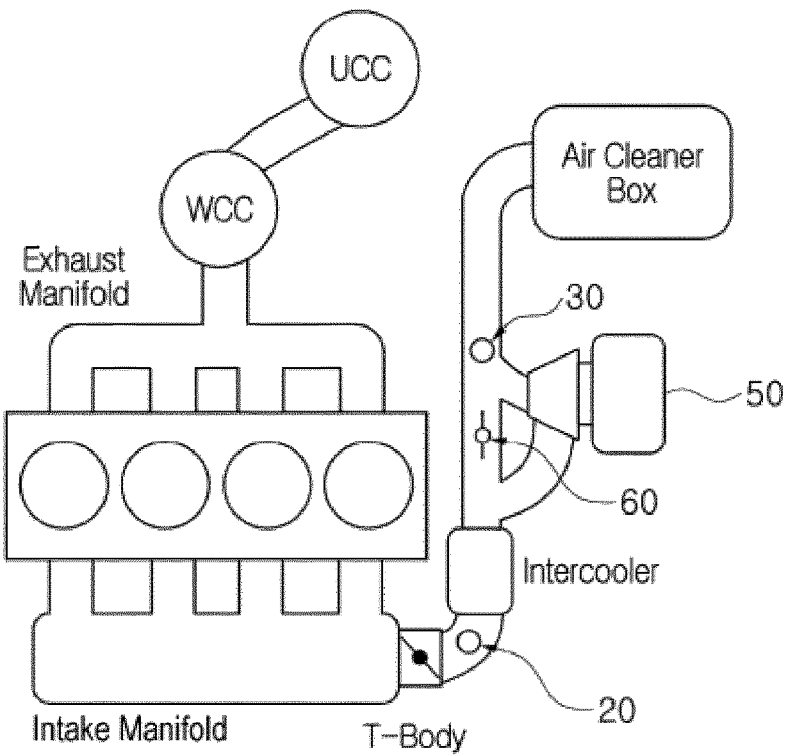
Figure 4:
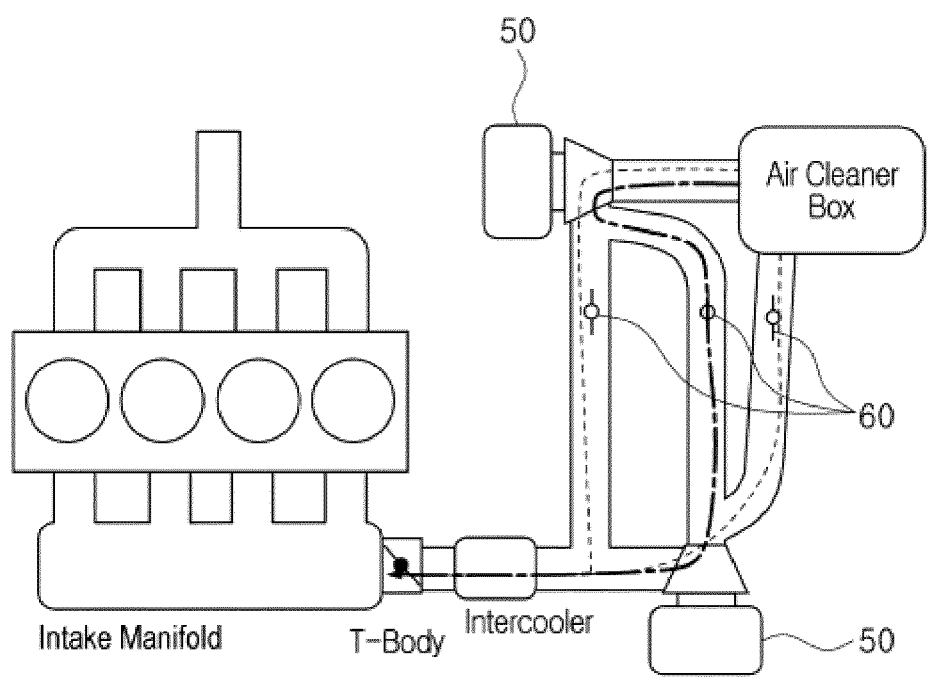
FIG. 4 is a drawing for explaining an apparatus for diagnosing bypass valve failure incorporating teachings of the present disclosure.

One example apparatus for diagnosing bypass valve failure is described below with reference to the drawings in which FIG. 1 is a block diagram of an apparatus for diagnosing bypass valve failure incorporating teachings of the present disclosure and FIG. 3 is a drawing for explaining the schematic structure of the apparatus for diagnosing bypass valve failure, while FIG. 4 is a drawing for explaining the apparatus for diagnosing bypass valve failure.

As shown in FIG. 1, the apparatus for diagnosing bypass valve failure comprises: a vehicle-state input unit (10); a first pressure sensor (20); a second pressure sensor (30); a control unit (40); an electric supercharger (50); and a bypass valve (60).

FIG. 3 is a schematic structural diagram of an example apparatus for diagnosing bypass valve failure. FIG. 3 (a) is a schematic structural diagram of an apparatus for diagnosing bypass valve failure when a turbocharger and electric supercharger system are both used, while FIG. 3 (b) shows a schematic structural diagram of an apparatus for diagnosing bypass valve failure when an electric supercharger substitutes a supercharger.

Herein, UCC is an acronym for "under-floor catalytic converter" and indicates a catalyst for reducing exhaust gases, and WCC is an acronym for "warm-up catalytic converter" and indicates a warm-up catalyst. Also, TC is a turbocharger, while Exhaust Manifold indicates an exhaust manifold and Intake Manifold indicates an intake manifold. Furthermore, T-Body is the throttle body and may be provided with a throttle valve which controls the amount of intake air, an ISC servo which controls the rotational speed when revolving, and a throttle position sensor (TPS) which detects the extent to which the throttle valve is open.

As shown in FIG. 1, the vehicle-state input unit (10) receives vehicle-state information and can receive input about the current operating state of the engine, the pedal on/off state, and the fuel-cut-period entry state from respective ECUs of the vehicle, and transmit same to the control unit (40).

Meanwhile, as shown in FIG. 3, the electric supercharger (50) may be provided on an intake line, and, although not shown in the Figures, comprises a motor and is actuated by the motor so as to supply supercharged air to the combustion chamber of the engine. Also, as shown in FIG. 3, the bypass valve (60) is provided on a bypass line which branches from the intake line where the electric supercharger (50) is provided, and which joins same at the front end of the throttle valve which adjusts the intake amount supplied to the combustion chamber. Therefore, in the embodiment shown, during control of the supercharging pressure, the bypass valve (60) prevents the fluctuation of the supercharging pressure during the transition period (non-boosting→boosting) and can be used as a recirculation valve for preventing surges under tip out (load reduction transition period) conditions.

In some embodiments, a first pressure sensor (20) is provided between the electric supercharger (50) and bypass valve (60) and the throttle valve (T-body) and detects the pressure between the electric supercharger (50) and bypass valve (60) and the throttle valve. In this instance, the first pressure sensor (20) can detect the pressure between the electric supercharger (50) and bypass valve (60) and the throttle valve so as to provide said pressure value (PRS_UP_THR) to the control unit (40).

In some embodiments, a second pressure sensor (30) is provided at the front end (upstream) of the electric supercharger (50) so as to be able to detect the pressure at the front end of the electric supercharger (50). In this instance, the second pressure sensor (30) can detect the pressure at the front end of the electric supercharger (50), so as to provide the pressure value (PRS_UP_ESCHA) to the control unit (40). The control unit (40) can receive input of the vehicle state from the vehicle-state input unit (10) so as to decide whether failure-diagnosis start conditions in order to start the failure diagnosis of the bypass valve (60), are satisfied.

In some embodiments, the control unit (40) receives input of the current operating state of the engine, the pedal on/off state, and the fuel-cut-period entry state from the vehicle-state input unit (10), and is able to decide that the conditions for starting the failure diagnosis of the bypass valve (60) are satisfied if, while the engine is currently operating, it is confirmed that during travel the driver's pedal is in the off-state and fuel-cut-period has been entered. Meanwhile, when the control unit (40) determines that the conditions for starting the failure diagnosis of the bypass valve (60) are satisfied and has started the failure diagnosis of a bypass valve (60), if the fuel cut state ends, the electric supercharger (50) enters the idle mode and diagnosis is started again together with a request to open the bypass valve (60).

Next, if the conditions for starting the failure diagnosis of the bypass valve (60) are satisfied, the control unit (40) transmits an 'open' or 'close' control instruction to the bypass valve (60). In addition, the control unit (40) transmits, to the electric supercharger (50), a specific rotational-speed target value, for determining whether the bypass valve (60) is in a normal open state or normal closed state, thereby making it possible to determine whether the bypass valve (60) is subject to stuck-open or stuck-closed failure.

In some embodiments, if the conditions for starting the failure diagnosis of the bypass valve are satisfied, the control unit (40) transmits an 'open' control instruction to the bypass valve (60) and sends, to the electric supercharger (50), a first rotational-speed target value (N_ESCHA_OPN_DIAG) for determining whether the bypass valve (60) is in a normal open state. In this instance, when operation is stopped or normal, the first rotational-speed target value (N_E-SCHA_OPN_DIAG) maybe applied as loading to the mass flow flowing through the flow path at a rotational speed less than the rotational speed during control so as to produce an amount of generated current (or amount of electricity).

In addition, if the electric supercharger (50) is operating at the first rotational-speed target value (N_ESCHA_OPN_DIAG) or is operating at a value within a predetermined range using the first rotational-speed target value (N_ESCHA_OPN_DIAG) as a reference, the control unit (40) monitors the amount of generated current (CUR_ESCHA) of the electric supercharger (50) for a first set time (CTR_ESCHA_OPN_DIAG_THD) so as to be able to determine whether the bypass valve (60) is subject to stuck-closed failure. That is, the control unit (40) can receive input of the actual (measured) rotational speed (N_ESCHA) of the electric supercharger (50) from the electric supercharger (50), so as to compare same with the first rotational-speed target value (N_ESCHA_OPN_DIAG).

In some embodiments, when the first set time (CTR_E-SCHA_OPN_DIAG_THD) has elapsed after the amount of generated current (CUR_ESCHA) of the electric supercharger (50) has exceeded a threshold value for a stuck-closed failure diagnosis (CUR_ESCHA_OPN_DI- AG_THD) of the bypass valve (60), the control unit (40) can determine that the bypass valve (60) is in a stuck-closed failure state. That is, the control unit (40) can receive input of the actual (measured) amount of generated current (CUR_ESCHA) of the electric supercharger (50) from the electric supercharger (50), so as to compare same with the threshold value for a stuck-closed failure diagnosis (CUR_ESCHA_OPN_DIAG_THD) of the bypass valve (60) for determining whether the bypass valve (60) is in the normal open state.

In some embodiments, the threshold value for the stuck-closed failure diagnosis (CUR_ESCHA_OPN_DIAG_THD) of the bypass valve (60) can have different values depending on the characteristics of the electric supercharger (50) and the engine and can be set based on a function of the engine rotational speeds, volume flow and temperature of the flow path. In addition, the first set time (CTR_ESCHA_OPN_DIAG_THD) can be pre-set as a hold time for when the amount of generated current (CUR_ESCHA) of the electric supercharger (50), for ultimately determining whether the bypass valve (60) is in the stuck-closed failure state, has exceeded the threshold value for the stuck-closed failure diagnosis (CUR_ESCHA_OPN_DIAG_THD) of the bypass valve (60).

Meanwhile, if the conditions for starting the failure diagnosis of the bypass valve (60) are satisfied, the control unit (40) transmits a 'close' control instruction to the bypass valve (60) and sends a second rotational-speed target value (N_ESCHA_CLS_DIAG) for determining whether the bypass valve (60) is in the normal closed state, to the electric supercharger (50), and then, when the electric supercharger (50) is operating at the second rotational-speed target value (N_ESCHA_CLS_DIAG) or is operating at a value within a predetermined range using the second rotational-speed target value (N_ESCHA_CLS_DIAG) as a reference, the control unit (40) monitors the pressure (PRS_UP_THP) detected by the first pressure sensor (20) for a second set time (CTR_ESCHA_CLS_DIAG_THD) so as to determine whether the bypass valve (60) is subject to stuck-open failure.

In some embodiments, the second rotational-speed target value (N_ESCHA_CLS_DIAG) can be set based on a function of the pressure ratio target value (PQ_ESCHA_CLS_DIAG) for the front and rear ends of the valve for determining whether the bypass valve (60) is in the normal closed state, the engine rotational speeds, volume flow and temperature of the flow path. Furthermore, the pressure-ratio target value (PQ_ESCHA_CLS_DIAG) for the front and rear ends of the valve can be set to a value which is obtained by dividing the pressure threshold value (PRS_UP_THR_ESCHA_CLS_DIAG) between the electric supercharger (50) and the throttle valve, for determining whether the bypass valve (60) is in the normal closed state, by the front-end pressure value (PRS_UP_ESCHA) of the electric supercharger (50), and the value obtained can be set as a value with a 1+ offset or more.

Meanwhile, when the pressure value (PRS_UP_THR) detected by the first pressure sensor (20) is less than the threshold value (PRS_UP_THR_ESCHA_CLS_DIAG_THD) for the stuck-open failure diagnosis of the bypass valve (60) and the second set time (CTR_ESCHA_CLS_DIAG_THD) has elapsed, the control unit (40) can decide that the bypass valve (60) is in a stuck-open failure state. In some embodiments, the threshold value (PRS_UP_THR_ESCHA_CLS_DIAG_THD) for the stuck-open failure diagnosis of the bypass valve (60) may be set to be no more than the pressure target value (PRS_UP_THR_ESCHA_CLS_DIAG) between the electric supercharger (50) and the throttle valve for determining whether the bypass valve (60) is in the normal closed state.

In some embodiments, the second set time (CTR_ESCHA_CLS_DIAG_THD) can be pre-set as a hold time for when the pressure value (PRS_UP_THR) between the electric supercharger (50) and the throttle valve is less than the threshold value (PRS_UP_THR_ESCHA_CLS_DIAG_THD) for the stuck-open failure diagnosis of the bypass valve (60).

Meanwhile, with reference to FIG. 4, the example apparatus shown for diagnosing bypass valve (60) failure can be used in all engine systems which use one or more electric superchargers (50) and bypass valves (60). For example, in a single bank engine (e.g. n cylinders in series), an electric supercharger (#1)+bypass valve (#1) can be included, and in a two-bank engine (e.g. n cylinders in a V-shape), an electric supercharger (#1)+bypass valve (#1) (Bank #1)+an electric supercharger (#2)+bypass valve (#2) (Bank #2) can be included. Furthermore, as shown in FIG. 4, in a dual electric supercharger system, electric superchargers*2+bypass valves*3 can be included.

Figure 2:
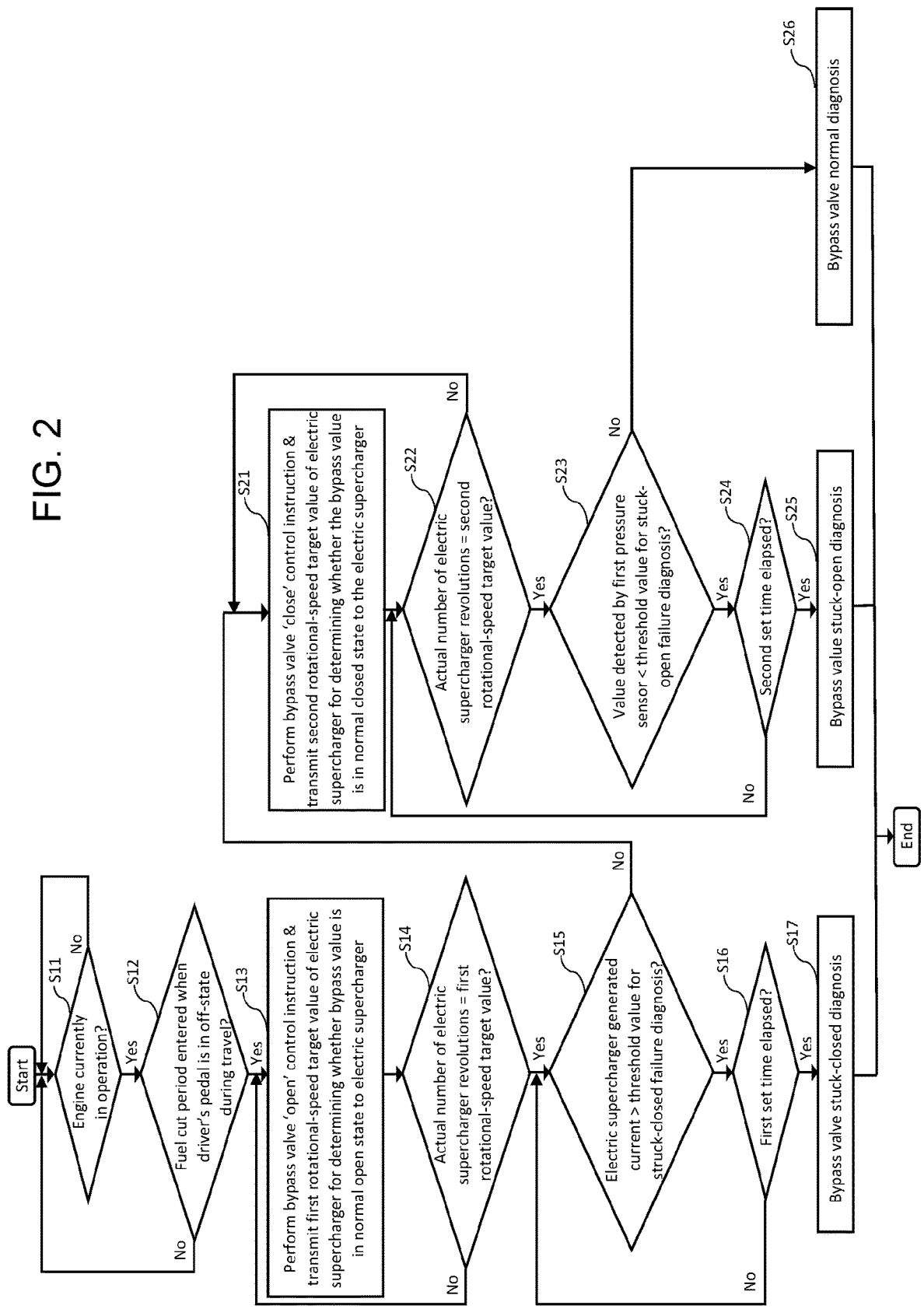
FIG. 2 is a flowchart for explaining a method for diagnosing bypass valve failure incorporating teachings of the present disclosure.

FIG. 2 is a flowchart for explaining a method for diagnosing bypass valve failure incorporating teachings of the present disclosure, and the method for diagnosing bypass valve failure will be described as follows. As shown in FIG. 2, the control unit (40) first checks the current operating state of the engine (S11).

In step S11, when the engine is confirmed to be currently in operation, the control unit (40) checks whether the fuel-cut-period has been entered when the driver's pedal is in the off-state during travel (S12). That is, the control unit (40) receives input of the vehicle state from the vehicle-state input unit (10) so as to be able to determine whether the failure diagnosis start conditions are satisfied in order to start failure diagnosis of the bypass valve (60).

In this instance, the control unit (40) receives input of the current operating state of the engine, the pedal on/off state, and the fuel-cut-period entry state from the vehicle-state input unit (10), so as to be able to decide that the conditions for starting the failure diagnosis of the bypass valve (60) are satisfied if, while the engine is currently operating, it is confirmed that during travel the driver's pedal is in the off-state and fuel-cut-period has been entered.

Next in steps S11 and S12, if the conditions for starting the failure diagnosis of the bypass valve (60) are satisfied, the control unit (40) transmits an 'open' control instruction to the bypass valve (60) and at the same time sends a first rotational-speed target value (N_ESCHA_OPN_DIAG) for determining whether the bypass valve (60) is in the normal open state to the electric supercharger (50) (S13). In this instance, when operation is stopped or normal, the first rotational-speed target value (N_ESCHA_OPN_DIAG) may be applied as loading to the mass flow flowing through the flow path at a rotational speed less than the rotational speed during control so as to produce an amount of generated current (or amount of electricity).

Meanwhile, when the control unit (40) determines that the conditions for starting the failure diagnosis of the bypass valve (60) are satisfied and has started the failure diagnosis of a bypass valve (60), if the fuel cut state ends, the electric supercharger (50) enters the idle mode and diagnosis is started again together with a request to open the bypass valve (60). That is, control unit (40) can return to the starting step in all processes if the fuel cut state ends. In addition, the control unit (40) checks whether the actual rotational speed (N_ESCHA) of the electric supercharger (50) is the same as the first rotational-speed target value (N_ESCHA_OPN_DIAG) (S14).

That is, the control unit (40) can check whether the electric supercharger (50) is operating at the first rotational-speed target value (N_ESCHA_OPN_DIAG), and in this instance, can set the error range so as to decide that operation is happening at the same rotational speed even when operating at a value within the error range. In this instance, the control unit (40) can return to step S13 when the actual rotational speed (N_ESCHA) of the electric supercharger (50) is not the same as the first rotational-speed target value (N_ESCHA_OPN_DIAG).

In addition, the control unit (40) checks whether the amount of generated current (CUR_ESCHA) of the electric supercharger (50) has exceeded the threshold value for a stuck-closed failure diagnosis (CUR_ESCHA_OPN_DIAG_THD) (S15). Here, the threshold value for the stuck-closed failure diagnosis (CUR_ESCHA_OPN_DIAG_THD) of the bypass valve (60) can have different values depending on the characteristics of the electric supercharger (50) and the engine and can be set based on a function of the engine rotational speeds, volume flow and temperature of the flow path.

In step S15, when the amount of generated current (CUR_ESCHA) of the electric supercharger (50) has exceeded the threshold value for a stuck-closed failure diagnosis (CUR_ESCHA_OPN_DIAG_THD), the control unit (40) confirms that a first set time has elapsed (S16). That is, the control unit (40) monitors the amount of generated current (CUR_ESCHA) of the electric supercharger (50) for a first set time (CTR_ESCHA_OPN_DIAG_THD) so as to be able to determine whether the bypass valve (60) is subject to stuck-closed failure. In this instance, when the first set time (CTR_ESCHA_OPN_DIAG_THD) has elapsed after the amount of generated current (CUR_ESCHA) of the electric supercharger (50) has exceeded the threshold value for a stuck-closed failure diagnosis (CUR_ESCHA_OPN_DIAG_THD) of the bypass valve (60), the control unit (40) can determine that the bypass valve (60) is in a stuck-closed failure state (S17).

That is, the control unit (40) can receive input of the actual (measured) amount of generated current (CUR_ESCHA) of the electric supercharger (50) from the electric supercharger (50), so as to compare same with the threshold value for a stuck-closed failure diagnosis (CUR_ESCHA_OPN_DIAG_THD) of the bypass valve (60) for determining whether the bypass valve (60) is in the normal open state. In addition, the first set time (CTR_ESCHA_OPN_DIAG_THD) can be pre-set as a hold time for when the amount of generated current (CUR_ESCHA) of the electric supercharger (50), for ultimately determining whether the bypass valve (60) is in the stuck-closed failure state, has exceeded the threshold value for the stuck-closed failure diagnosis (CUR_ESCHA_OPN_DIAG_THD) of the bypass valve (60).

Meanwhile, in step S15, when the amount of generated current (CUR_ESCHA) of the electric supercharger (50) is no more than the threshold value for a stuck-closed failure diagnosis (CUR_ESCHA_OPN_DIAG_THD), the control unit (40) transmits a 'close' control instruction to the bypass valve (60) and sends a second rotational-speed target value (N_ESCHA_CLS_DIAG) for determining whether the bypass valve is in the normal closed state, (60) to the electric supercharger (50) (S21).

Next, the control unit (40) checks whether the actual rotational speed (N_ESCHA) of the electric supercharger (50) is the same as the second rotational-speed target value (N_ESCHA_CLS_DIAG) (S22). That is, the control unit (40) can check whether the electric supercharger (50) is operating at the second rotational-speed target value (N_ESCHA_CLS_DIAG), and in this instance, can set the error range so as to decide that operation is happening at the same rotational speed even when operating at a value within the error range.

That is, when the electric supercharger (50) operates at the second rotational-speed target value (N_ESCHA_CLS_DIAG) or operates at a value within a predetermined range using the second rotational-speed target value (N_ESCHA_CLS_DIAG) as a reference, the control unit (40) compares the pressure (PRS_UP_THP) detected by the first pressure sensor (20) with the threshold value for a stuck-open failure diagnosis (PRS_UP_THR_ESCHA_CLS_DIAG_THD) of the bypass valve (60) (S23).

In some embodiments, the second rotational-speed target value (N_ESCHA_CLS_DIAG) can be set based on a function of the pressure ratio target value (PQ_ESCHA_CLS_DIAG) for the front and rear ends of the valve for determining whether the bypass valve (60) is in the normal closed state, the engine rotational speeds, volume flow and temperature of the flow path. Furthermore, the pressure-ratio target value (PQ_ESCHA_CLS_DIAG) for the front and rear ends of the valve can be set to a value which is obtained by dividing the pressure threshold value (PRS_UP_THR_ESCHA_CLS_DIAG) between the electric supercharger (50) and the throttle valve, for determining whether the bypass valve (60) is in the normal closed state, by the front-end pressure value (PRS_UP_ESCHA) of the electric supercharger (50), and the value obtained can be set as a value with a 1+ offset or more.

In step S23, when the pressure value (PRS_UP_THR) detected by the first pressure sensor (20) is less than the threshold value for a stuck-open failure diagnosis (PRS_UP_THR_ESCHA_CLS_DIAG_THD) of the bypass valve (60), the control unit (40) checks whether a second set time has elapsed (S24). In this instance, the control unit (40) monitors, over a second set time (CTR_ESCHA_CLS_DIAG_THD), the state in which the pressure value (PRS_UP_THR) detected by the first pressure sensor (20) is less than the threshold value for a stuck-open failure diagnosis (PRS_UP_THR_ESCHA_CLS_DIAG_THD) of the bypass valve (60) so as to be able to determine whether the bypass valve (60) is subject to stuck-open failure.

That is, when the pressure value (PRS_UP_THR) detected by the first pressure sensor (20) is less than the threshold value for a stuck-open failure diagnosis (PRS_UP_THR_ESCHA_CLS_DIAG_THD) of the bypass valve (60) and the second set time (CTR_ESCHA_CLS_DIAG_THD) has elapsed, the control unit (40) can decide that the bypass valve (60) is in a stuck-open failure state (S25). In this instance, the threshold value for the stuck-open failure diagnosis (PRS_UP_THR_ESCHA_CLS_DIAG_THD) of the bypass valve (60) may be set to be no more than the pressure target value (PRS_UP_THR_ESCHA_CLS_DIAG) between the electric supercharger (50) and the throttle valve for determining whether the bypass valve (60) is in the normal closed state.

Furthermore, the second set time (CTR_ESCHA_CLS_DIAG_THD) can be pre-set as a hold time for when the pressure value (PRS_UP_THR) between the electric supercharger (50) and the throttle valve is less than the threshold value (PRS_UP_THR_ESCHA_CLS_DIAG_THD) for the stuck-open failure diagnosis of the bypass valve (60). Meanwhile, in step S24, when the state in which the pressure value (PRS_UP_THR) detected by the first pressure sensor (20) is less than the threshold value for a stuck-open failure diagnosis (PRS_UP_THR_ESCHA_CLS_DIAG_THD) of the bypass valve (60) is not held for the second set time (CTR_ESCHA_CLS_DIAG_THD), the control unit (40) may return to step S22 and compare the actual rotational speed (N_ESCHA) of the electric supercharger (50) with the second rotational-speed target value (N_ESCHA_CLS_DIAG).

In addition, in step S23, when the pressure value (PRS_UP_THR) detected by the first pressure sensor (20) is less than the threshold value for a stuck-open failure diagnosis (PRS_UP_THR_ESCHA_CLS_DIAG_THD) of the bypass valve (60), the control unit (40) can diagnose the bypass valve (60) to be normal (S26).

In some embodiments, in the case of a mechanical bypass valve (60), the valve can be actuated by means of the pressure difference at the front and rear ends of the valve without 'open'/'close' instructions from a separate controller. That is, in the case of a mechanical bypass valve (60), the open state is the default and, during boosting, closing can be effected by the boosting force being larger than the spring force. In other words, in the case of a mechanical bypass valve (60), when the pressure ratio up and down stream of the valve is less than 1+offset, the valve is mechanically opened, while when the pressure ratio up and down stream of the valve is more than 1+offset, the valve is mechanically closed. Therefore, unlike the electronic bypass valve (60), when a mechanical bypass valve (60) is applied, the aforementioned instruction steps (S13, S21) for opening/closing the valve can be omitted.

As described above, the apparatus and method for diagnosing bypass valve failure according to an embodiment of the teachings of the present disclosure have the advantage of being designed to be capable of diagnosing the failure regardless of the type of electronic or mechanical bypass valve, by performing failure diagnosis in a bypass valve through the value of the generated current from the drive motor in an internal combustion engine fitted with an electric supercharger system.

Furthermore, the apparatuses and methods described herein for diagnosing bypass valve failure have the advantages of being able to aid the maintenance of an engine through transmission of the diagnosis results by distinguishing whether there is failure of the bypass valve, and able to prevent a breakdown due to engine abnormalities through activation of a 'limp home' mode in advance when a bypass valve failure is determined.

Although the teachings herein have been described with reference to the embodiments illustrated in the drawings, this is merely illustrative. It will be understood by those skilled in the art that it is possible to implement various modifications and other equivalent embodiments based thereon.

10: Vehicle-state input unit (engine, pedal, fuel cut)
20: First pressure sensor
30: Second pressure sensor
40: Control unit
50: Electric supercharger
60: Bypass valve

What is claimed is:

1. An apparatus for diagnosing bypass valve failure in an electric supercharger with a motor and an electric compressor actuated by the motor to supply supercharged air to the combustion chamber of an engine, the apparatus comprising:
a bypass valve on a bypass line branching from an intake line with the electric supercharger, wherein the bypass valve joins the intake line at the front end of a throttle valve for adjusting an intake amount supplied to the combustion chamber;
a vehicle-state input unit receiving vehicle-state information; and
a control unit which assesses the vehicle-state information to determine whether failure criteria of a bypass valve start are satisfied; and
if the failure criteria are satisfied, the control unit transmits 'open' or 'close' control instructions to the bypass valve and transmits, to the electric supercharger, a specific rotational-speed target value for determining whether the bypass valve is in the normal open state or the normal closed state, thereby determining whether the bypass valve is subject to stuck-open failure or stuck-closed failure.

2. The apparatus for diagnosing bypass valve failure of claim 1, wherein the control unit receives information indicating a current operating state of the engine, the pedal on/off state, and the fuel-cut-period entry state from the vehicle-state input unit, and determines whether the failure criteria are satisfied if, while the engine is currently operating, it is confirmed that during travel the driver's pedal is in the off-state and fuel-cut-period has been entered.

3. The apparatus for diagnosing bypass valve failure of claim 1, wherein if the conditions for starting the failure diagnosis of the bypass valve are satisfied, the control unit transmits an 'open' control instruction to the bypass valve and sends a first rotational-speed target value for determining whether the bypass valve is in the normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time so as to determine whether the bypass valve is subject to stuck-closed failure.

4. The apparatus for diagnosing the failure of a bypass valve of claim 3, wherein, when the first set time has elapsed after the amount of generated current of the electric supercharger has exceeded the threshold value for a stuck-closed failure diagnosis of the bypass valve, the control unit decides that the bypass valve is in a stuck-closed failure state.

5. The apparatus for diagnosing bypass valve failure of claim 1, further comprising a first pressure sensor detecting the pressure between the electric supercharger and a bypass valve and a throttle valve, wherein, if the failure criteria are satisfied, the control unit transmits a 'close' control instruction to the bypass valve and sends a second rotational-speed target value for determining whether the bypass valve is in the normal closed state, to the electric supercharger, and then, when the electric supercharger is operating at the second rotational-speed target value or is operating at a value within a predetermined range using the second rotational-speed target value as a reference, the control unit monitors the pressure detected by the first pressure sensor for a second set time and determines whether the bypass valve is subject to stuck-open failure.

6. The apparatus for diagnosing the failure of a bypass valve of claim 5, wherein, when the pressure value detected by the first pressure sensor is less than the threshold value for a stuck-open failure diagnosis of the bypass valve and the second set time has elapsed, the control unit decides that the bypass valve is in a stuck-open failure state.

7. A method for diagnosing bypass valve failure, the method comprising:
- receiving vehicle-state information from a vehicle-state input unit at a control unit;
- determining whether failure criteria are satisfied;
- in response to the failure criteria being satisfied, transmitting 'open' or 'close' control instructions to the bypass valve;
- transmitting to an electric supercharger a specific rotational-speed target value for determining whether the bypass valve is in a normal open state or a normal closed state; and
- determining whether the bypass valve is subject to stuck-open failure or stuck-closed failure,
- wherein the electric supercharger comprises a motor and an electric compressor actuated by the motor so as to supply supercharged air to the combustion chamber of the engine, and
- the bypass valve is provided on a bypass line which branches from an intake line where the electric supercharger is provided, and which joins same to the front end of a throttle valve which adjusts the intake amount supplied to the combustion chamber.

8. The method for diagnosing bypass valve failure of claim 7, wherein, in the step of determining whether the failure criteria are satisfied, the control unit receives input of the current operating state of the engine, the pedal on/off state, and the fuel-cut-period entry state from the vehicle-state input unit, and which decides that the failure criteria are determined to be satisfied if, while the engine is currently operating, it is confirmed that during travel the driver's pedal is in the off-state and fuel-cut-period has been entered.

9. The method for diagnosing bypass valve failure of claim 7, wherein, if the failure criteria are satisfied, the control unit transmits an 'open' control instruction to the bypass valve and sends a first rotational-speed target value, for determining whether the bypass valve is in the normal open state, to the electric supercharger, and then, when the electric supercharger is operating at the first rotational-speed target value or is operating at a value within a predetermined range using the first rotational-speed target value as a reference, the control unit monitors the amount of generated current of the electric supercharger for a first set time and determines whether the bypass valve is subject to stuck-closed failure.

10. The method for diagnosing the failure of a bypass valve of claim 9, wherein, when the first set time has elapsed after the amount of generated current of the electric supercharger has exceeded the threshold value for a stuck-closed failure diagnosis of the bypass valve, the control unit decides that the bypass valve is in a stuck-closed failure state.

11. The method for diagnosing bypass valve failure of claim 7, further comprising receiving a pressure value at the control unit from a first pressure sensor which detects the pressure between the electric supercharger and the bypass valve and throttle valve, wherein, if the conditions for starting the failure diagnosis of the bypass valve are satisfied, the control unit transmits an 'close' control instruction to the bypass valve and sends a second rotational-speed target value for determining whether the state is the normal closed state of the bypass valve, to the electric supercharger, and then, when the electric supercharger is operating at the second rotational-speed target value or is operating at a value within a predetermined range using the second rotational-speed target value as a reference, the control unit monitors the pressure detected by the first pressure sensor for a second set time and determines whether the bypass valve is subject to stuck-open failure.

12. The apparatus for diagnosing the failure of a bypass valve of claim 11, wherein, when the pressure value detected by the first pressure sensor is less than the threshold value for a stuck-open failure diagnosis of the bypass valve and the second set time has elapsed, the control unit decides that the bypass valve is in a stuck-open failure state.

* * * * *